(12) United States Patent
Turner et al.

(10) Patent No.: US 7,763,538 B2
(45) Date of Patent: Jul. 27, 2010

(54) DUAL PLASMA TREATMENT BARRIER FILM TO REDUCE LOW-K DAMAGE

(75) Inventors: Michael D. Turner, San Antonio, TX (US); Ritwik Chatterjee, Austin, TX (US); Stanley M. Filipiak, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/328,693

(22) Filed: Jan. 10, 2006

(65) Prior Publication Data

US 2007/0161229 A1   Jul. 12, 2007

(51) Int. Cl.
*H01L 21/4763* (2006.01)

(52) U.S. Cl. ............... 438/643; 438/627; 257/E21.171

(58) Field of Classification Search .................. 438/623, 438/624, 642, 643, 627, 629
See application file for complete search history.

(56) References Cited

U.S. PATENT DOCUMENTS

| | | | |
|---|---|---|---|
| 6,114,259 A | 9/2000 | Sukharev et al. | |
| 6,165,894 A * | 12/2000 | Pramanick et al. | 438/627 |
| 6,184,138 B1 * | 2/2001 | Ho et al. | 438/687 |
| 6,268,294 B1 | 7/2001 | Jang et al. | |
| 6,319,842 B1 * | 11/2001 | Khosla et al. | 438/714 |
| 6,737,747 B2 | 5/2004 | Barth et al. | |
| 6,753,249 B1 * | 6/2004 | Chen et al. | 438/637 |
| 6,790,784 B2 | 9/2004 | Catabay et al. | |
| 6,803,300 B2 * | 10/2004 | Higashi et al. | 438/598 |
| 6,818,557 B1 * | 11/2004 | Ngo et al. | 438/687 |
| 2002/0106891 A1 * | 8/2002 | Kim et al. | 438/624 |
| 2002/0177329 A1 * | 11/2002 | Yang et al. | 438/798 |
| 2004/0214425 A1 * | 10/2004 | Lin et al. | 438/629 |
| 2004/0238962 A1 * | 12/2004 | Jung et al. | 257/758 |
| 2004/0253740 A1 * | 12/2004 | Shalyt et al. | 436/124 |
| 2005/0014391 A1 * | 1/2005 | Shioya et al. | 438/789 |
| 2005/0064698 A1 * | 3/2005 | Chang et al. | 438/623 |
| 2005/0147762 A1 * | 7/2005 | Dubin et al. | 427/437 |
| 2007/0035026 A1 * | 2/2007 | Su et al. | 257/758 |

* cited by examiner

*Primary Examiner*—Walter L Lindsay, Jr.
*Assistant Examiner*—Reema Patel
(74) *Attorney, Agent, or Firm*—John A. Fortkort; Fortkort & Houston P.C.

(57) ABSTRACT

A method is provided for creating a barrier layer (217) on a substrate comprising a dielectric layer (203) and a metal interconnect (211). In accordance with the method, the substrate is treated with a first plasma comprising helium, thereby forming a treated substrate. The treated substrate is then exposed to a second plasma selected from the group consisting of oxidizing plasmas and reducing plasmas. Next, a barrier layer is created on the treated substrate.

19 Claims, 5 Drawing Sheets

DUAL PLASMA TREATMENT BARRIER FILM TO REDUCE LOW-K DAMAGE

FIELD OF THE DISCLOSURE

The present disclosure relates generally to semiconductor devices, and more particularly to methods for creating barrier films on inter-level dielectrics (ILDs) in such devices.

BACKGROUND OF THE DISCLOSURE

In the past, metal interconnects were typically formed in semiconductor devices by depositing a layer of aluminum on a substrate, patterning the aluminum to form the desired interconnects, and then filling the spaces between the interconnects with a suitable dielectric material such as silicon oxide. More recently, it has become desirable to substitute copper for aluminum in many interconnect applications, due to the lower resistivity and lower susceptibility to electromigration (EM) failure of copper as compared to aluminum. Since copper interconnects, unlike their aluminum counterparts, cannot be easily formed by depositing and patterning a layer of the metal on a substrate, this substitution has necessitated the development of a different fabrication process (referred to in the art as a damascene or inlaid process) for the formation of copper interconnects.

Figure 1:
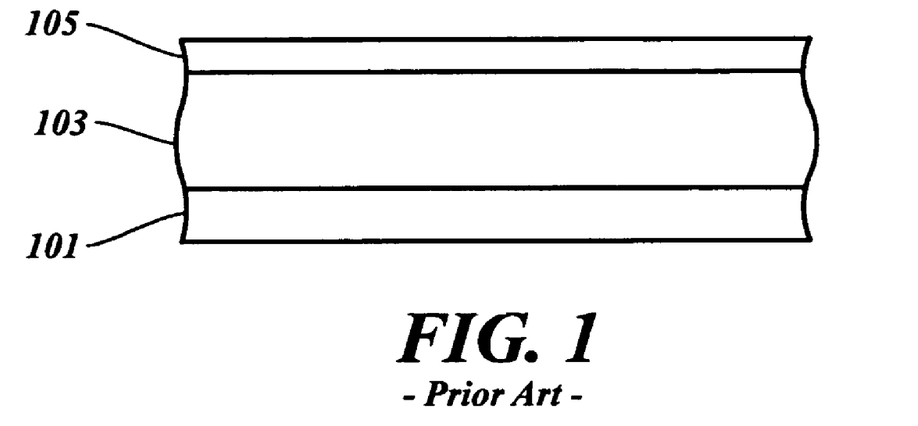
FIG. 1 is an illustration of a step in a prior art process for making a damascene structure.

One known embodiment of the damascene process is illustrated in FIGS. 1-5. As seen in FIG. 1, at the beginning of that process, an inter-level dielectric (ILD) 103 is blanket deposited over a substrate 101, the latter of which will often be an integrated circuit structure. A cap layer 105, which may comprise a material such as tetraethylorthosilicate glass (TEOS), is then formed over the ILD 103.

Figure 2:
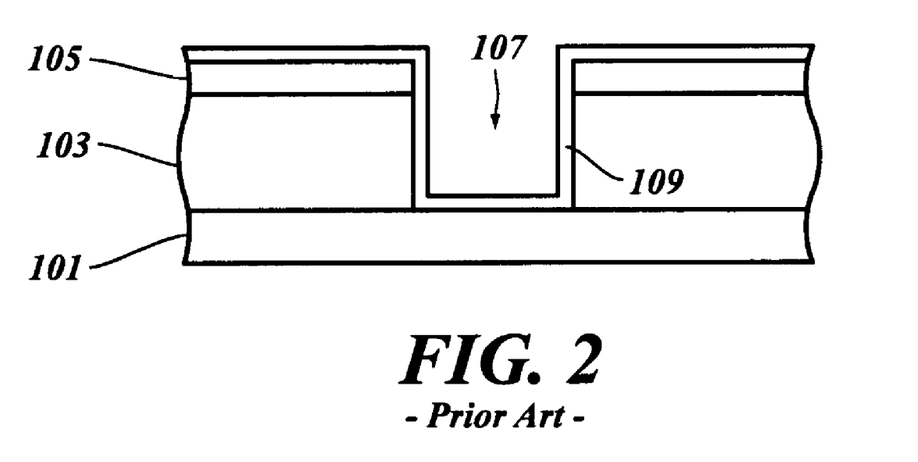
FIG. 2 is an illustration of a step in a prior art process for making a damascene structure.

With reference to FIG. 2, one or more trenches 107 having a geometry conforming to the desired pattern of copper metal interconnects are then formed in the ILD 103. A barrier metal 109 is deposited over the ILD 103 (and over the surfaces of the trenches 107 defined therein) to facilitate adhesion between the ILD 103 and the subsequently deposited copper layer 111 (see FIG. 3), and to prevent migration of the copper into the ILD 103.

Figure 3:
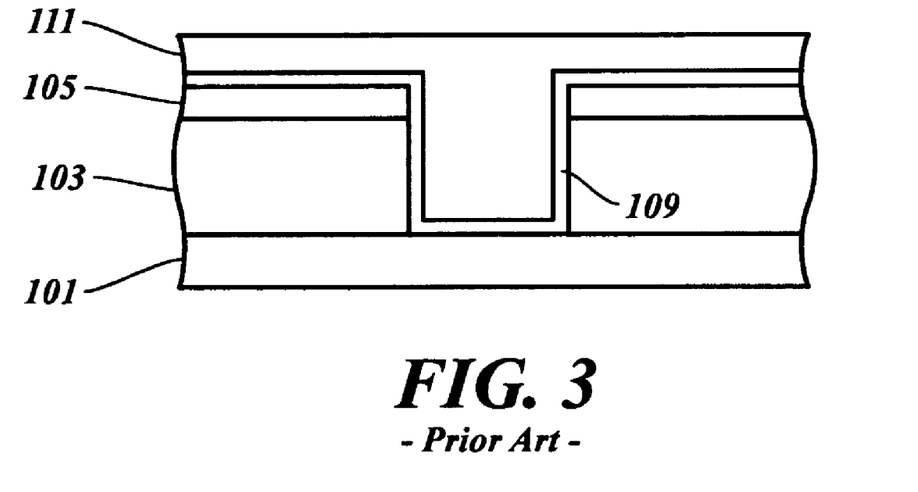
FIG. 3 is an illustration of a step in a prior art process for making a damascene structure.

As seen in FIG. 3, a layer of copper metal 111 is then blanket deposited over the structure. This copper layer 111 fills the trenches 107 (see FIG. 2) and also forms a layer that extends over the cap layer 105.

Figure 4:
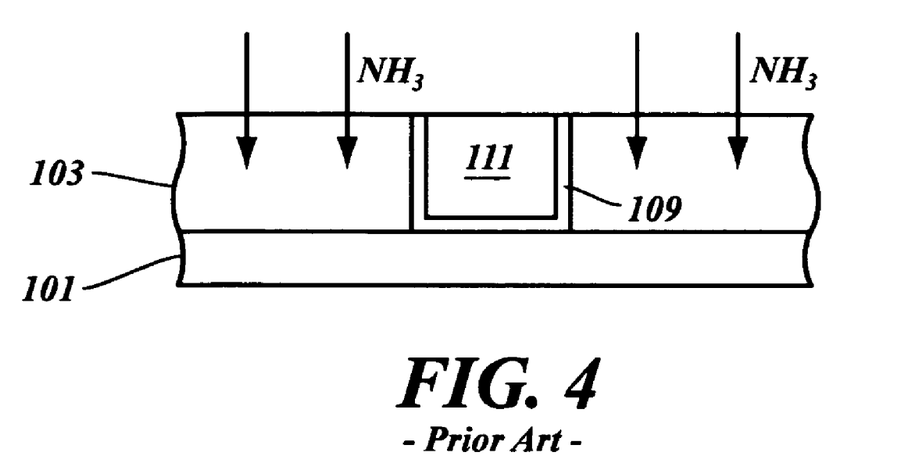
FIG. 4 is an illustration of a step in a prior art process for making a damascene structure.
Figure 5:
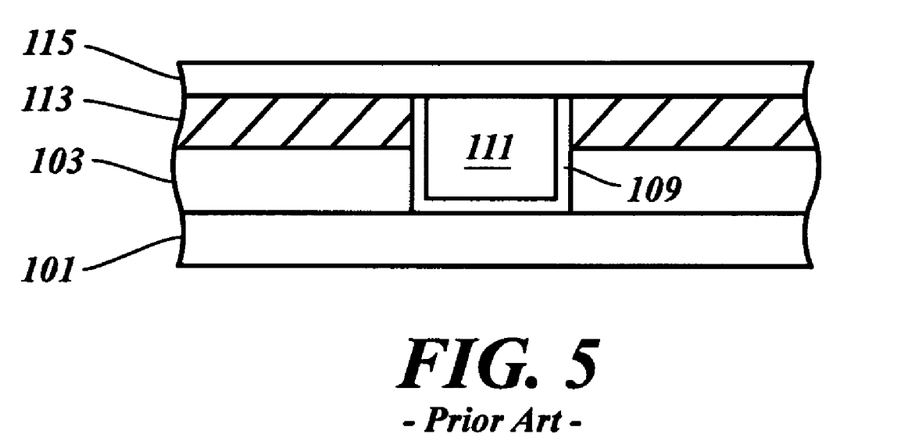
FIG. 5 is an illustration of a step in a prior art process for making a damascene structure.

As seen in FIG. 4, the excess copper, the cap layer 105 and a portion of the adhesion promoting layer 109 are removed from the surface of the ILD 103 by a chemical mechanical polishing (CMP) process, thus leaving the desired pattern of copper metal interconnects 111 in the trenches formed in the ILD 103. Then, the exposed surfaces of the copper interconnects 111 are treated with a reducing plasma such as $NH_3/N_2$ to remove copper oxide from the surfaces thereof, and to improve the resistance of the copper interconnects 111 to electromigration. Treatment with the reducing plasma also serves to facilitate adhesion between the copper interconnects 111 and the subsequently deposited barrier film 115, which is depicted in FIG. 5.

The foregoing process for forming copper metal interconnects may also be combined with a process for forming copper-filled vias by using a stack of two dielectric layers, with via openings formed in the lower dielectric layer and trench openings formed in the upper dielectric layer. Both the vias and the trenches are then backfilled with copper during a single copper deposition step. In this process, commonly referred to in the art as a dual damascene or dual-inlaid process, excess copper is again removed from the surface of the upper layer of dielectric material by CMP, leaving behind a pattern of copper metal interconnects that are vertically connected by copper-filled vias to the underlying integrated circuit structure.

In both the damascene and dual damascene processes as they are typically implemented in the formation of advanced integrated circuit devices, an ILD is typically used to electrically separate the closely spaced metal interconnect lines that are arranged on several levels in the device. In the past, the material of choice for this ILD was silicon oxide, which has a k-value or dielectric constant of 4.2. However, as circuit densities have increased, it has become desirable, in order to minimize capacitive coupling and cross-talk between adjacent metal lines, to use ILD materials in these applications that have dielectric constants or k-values that are even lower, and that are ideally as close to 1 as possible. This has led to the replacement of silicon oxide in ILDs with other, lower dielectric constant materials, such as carbon-doped silicon oxides. Depending on their dielectric constants, such materials are referred to as low-k dielectrics (for materials having k values of less than 4.1) or ultra low-k dielectrics (for materials having k values of less than 2.7).

One result of damascene processing is that the ILD is exposed to a greater number of processing steps. At the same time, the low-k and ultra low-k dielectrics utilized in the ILD are more prone to processing related damage than silicon oxide. For example, in the process depicted in FIGS. 1-5, the exposure of the ILD to the $NH_3$-based reducing plasma, which is required to impart a good, low oxide metal surface to the copper layer 111, can damage the ILD 103 and increase the dielectric constant thereof. Specifically, if the ILD is a carbon-doped silicon oxide film, exposure of that film to reducing plasmas can result in carbon depletion and densification of the film, which can lead to an increase in the k-value of the integrated ILD film. Perhaps for this reason, the low-k ILDs utilized in damascene processes typically exhibit dielectric constants which are substantially higher than the values that are theoretically achievable with these materials. This increase in dielectric constant adversely affects device performance, and also stands as a significant impediment to the scalability of damascene processes.

Several variations in the damascene and dual damascene processes described above are also known to the art, and some of these variations do not utilize a reducing plasma to remove oxides from the copper interconnects. One such variation involves the use of a metallic copper diffusion barrier that is selectively plated onto the copper interconnects after the CMP step in either standard damascene or dual damascene processing. This metallic barrier can be plated by electroless or electroplated processes. Typically, electroless plated films, such as CoWB or CoWP, are utilized for this purpose. The use of metallic barrier films offer improved EM performance. Moreover, the use of such barrier films permits the elimination of dielectric copper barrier materials. Since these barrier films are typically higher-k films than the ILD, their removal reduces the integrated k-value of the overall interconnect film stack.

Although the ILD is not exposed to a reducing plasma for the treatment of the copper interconnects in such a process, the ILD is exposed to an oxidizing plasma during the deposition of dielectric layers for subsequent levels of interconnect. These dielectric layers may be adhesion promoting layers or the subsequent ILD layer. Unfortunately, it has been found that oxidizing plasmas, like reducing plasmas, also damage low-k dielectric films, and that integrated ILD layers subjected to this process suffer a similar increase in dielectric constant.

There is thus a need in the art for a process which overcomes these infirmities. In particular, there is a need in the art for a method for making semiconductor devices by a damascene or dual damascene process in which the dielectric constant of the ILD in the resulting device is closer to theoretically achievable values. There is further a need in the art for such a method in which the films are less susceptible to damage from subsequent processing steps and conditions, including exposure to oxidizing or reducing plasmas. These and other needs may be met by the methodologies and devices described herein.

DETAILED DESCRIPTION

As used herein, the term "reducing plasma" refers to a plasma used to reduce a metal interconnect.

As used herein, the term "oxidizing plasma" refers to a plasma used to oxidize a metal interconnect.

In one aspect, a method is provided for creating a barrier layer on a substrate comprising a dielectric layer (such as an inter-level dielectric or ILD) and a metal interconnect. In accordance with the method, the substrate is treated with a first plasma comprising helium, thereby forming a treated substrate. The treated substrate is then exposed to plasmas selected from the group consisting of oxidizing plasmas and reducing plasmas. A barrier layer may then be formed on the treated substrate.

In another aspect, a method for preparing a substrate comprising a dielectric layer and a cap layer for the application of a barrier layer thereto is provided. In accordance with the method, a substrate is provided which comprises a dielectric layer and a cap layer. A trench is created which extends through the cap layer and into the dielectric layer, and a layer of metal is deposited over the substrate, thereby filling the trench and creating a layer of metal which extends over the cap layer. The substrate is then subjected to chemical mechanical polishing so that the portion of the layer of metal which extends over the cap layer is removed, thereby exposing a portion of the dielectric layer, after which the exposed portion of the dielectric layer is treated with a first plasma comprising helium, thereby forming a treated surface. The layer of metal is then treated with a second plasma comprising $NH_3$, and a barrier layer is created on the treated surface and on the metal layer.

These and other aspects of the present disclosure are described in greater detail below.

It has now been found that the aforementioned problem with elevated dielectric constants in ILDs in devices made by damascene or dual processes can be solved, at least in part, through treatment of the surface of the ILD with a helium plasma prior to exposure of the ILD to an oxidizing plasma. By treating the ILD in this manner, damage to the ILD is minimized, and lower dielectric constants are achieved.

Without wishing to be bound by theory, it is believed that exposure of the ILD to the He plasma induces the formation of a very thin passivation layer on the surface of the ILD which is relatively impervious to both reducing and oxidizing plasmas and chemistries. For example, in the process depicted in FIGS. 1-5, such a passivation layer protects the underlying dielectric material from the subsequent copper oxide reduction chemistry (e.g., $NH_3$ plasma) that is utilized to provide appropriate adhesion between the subsequently deposited barrier film and the copper line. Absent the formation of such a passivation layer, exposure of the ILD to the $NH_3$ plasma is found to damage a significant portion of the bulk of the ILD, thereby significantly increasing its k-value and the integrated k-value of the overall dielectric stack. The thin passivation layer formed by the helium plasma also prevents similar damage from occurring due to exposure to oxidizing plasma treatments, thus making the helium plasma treatment useful for integration schemes where a dielectric barrier is not used.

Preferably, the helium plasma treatment will be performed in-situ with the subsequent treatment. For example, in a process utilizing an $NH_3/N_2$ plasma as the reducing chemistry, the helium plasma treatment will be performed in the same tool (and preferably in the same chamber) as the subsequent $NH_3/N_2$ treatment and barrier deposition step. This will ensure that the passivated surface will remain in partial vacuum until subsequent films are deposited. Without wishing to be bound by theory, it is believed that the passivation layer is more hydrophilic than the underlying low-k film. Consequently, by maintaining the substrate in a vacuum chamber after the He plasma treatment and by not exposing the passivation layer to ambient air, the possibility that the passivation layer will pick up moisture from the ambient environment is reduced. In this regard, it is to be noted that even small amounts of moisture adsorption can lead to significant increases in the dielectric constant of the film.

The methodologies and structures disclosed herein can be further appreciated with respect to the first non-limiting embodiment, depicted in FIGS. 6-11, of a damascene process in accordance with the teachings herein.

Figure 6:
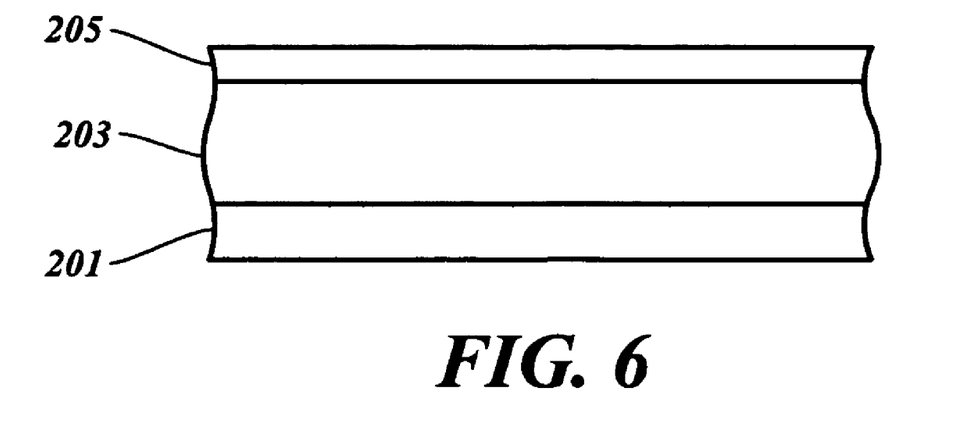
FIG. 6 is an illustration of a step in a process for making a damascene structure in accordance with the teachings herein.

As seen in FIG. 6, at the beginning of the process, an ILD 203 is formed through blanket deposition of a (preferably low-k or ultra low-k) dielectric material over a substrate 201. The substrate will typically be an integrated circuit structure. A cap layer 205, which may comprise a material such as TEOS, is then formed over the dielectric layer 203.

Figure 7:
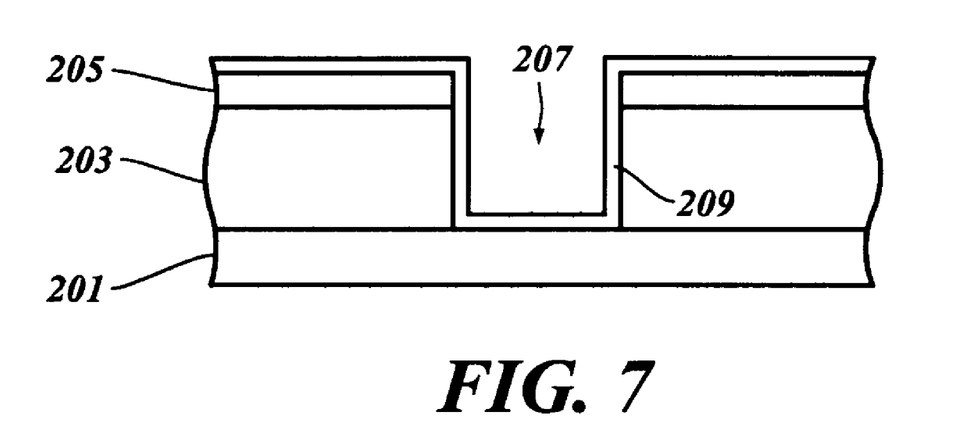
FIG. 7 is an illustration of a step in a process for making a damascene structure in accordance with the teachings herein.
Figure 8:
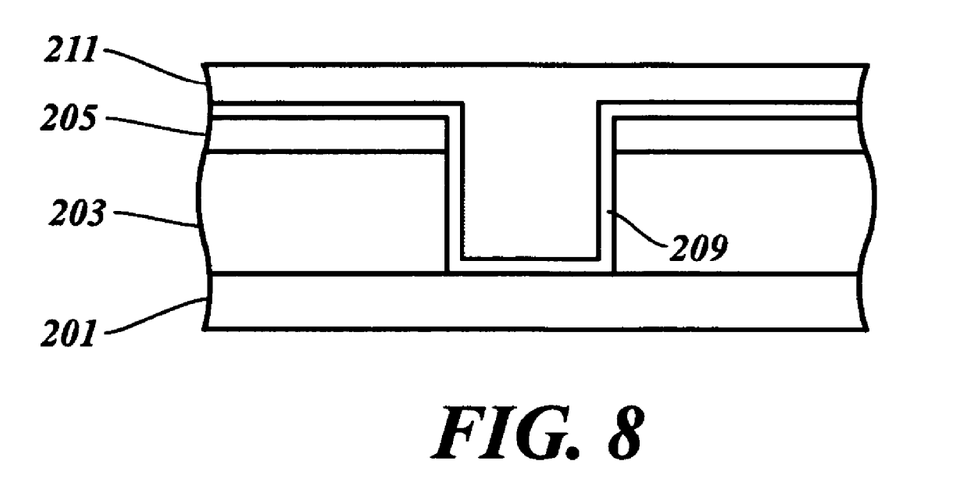
FIG. 8 is an illustration of a step in a process for making a damascene structure in accordance with the teachings herein.

As seen in FIG. 7, one or more trenches 207 having a geometry conforming to the desired pattern of copper metal interconnects is then formed in the dielectric layer 203. One or more thin layers of a barrier metal 209 are preferably formed over the ILD 203 (and over the surfaces of the trenches 207 defined therein) to serve as a barrier to prevent migration of the subsequently deposited copper layer 211 (see FIG. 8) into the ILD 203, and to facilitate adhesion of the copper layer 211 to the ILD 203. Then, as seen in FIG. 8, a layer of copper 211 is blanket deposited over the structure. The layer of copper 211 fills the trenches 207, and also forms a layer which extends over the cap layer 205.

Figure 9:
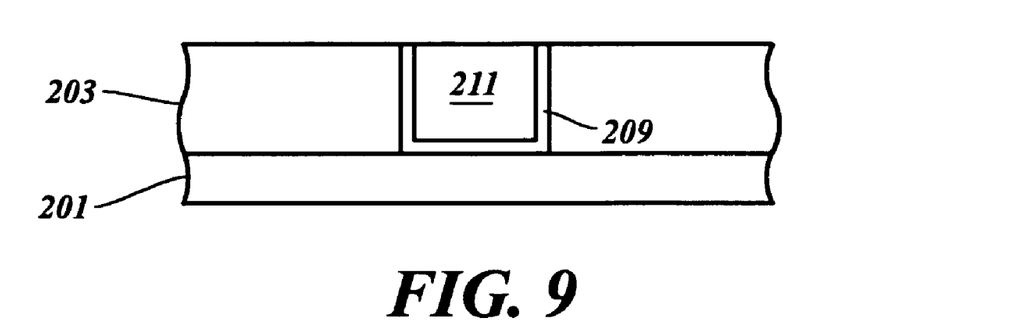
FIG. 9 is an illustration of a step in a process for making a damascene structure in accordance with the teachings herein.

With reference to FIG. 9, the excess copper 211, along with the cap layer 205 and a portion of the barrier metal layer 209, is removed from the surface of the ILD 203 through a chemical mechanical polishing (CMP) process, thus leaving the desired pattern of copper metal interconnects 211 in the trenches in the ILD 203.

Figure 10:
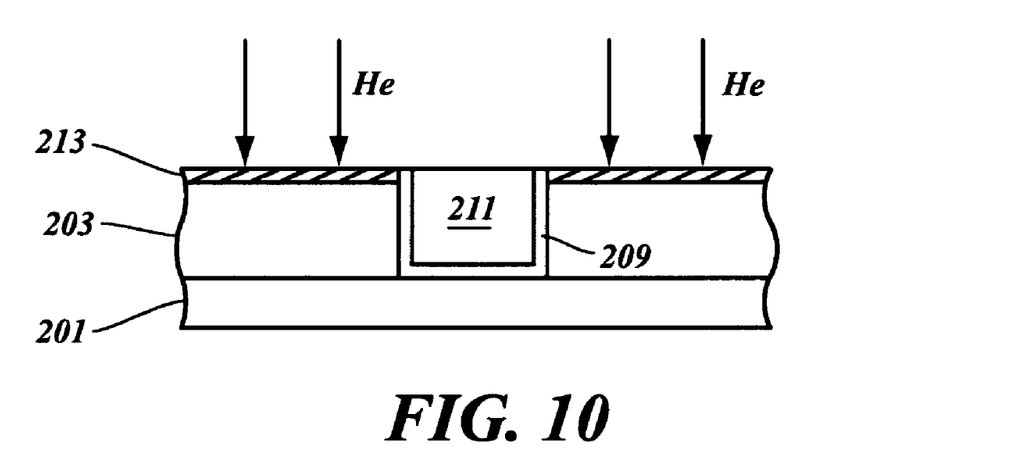
FIG. 10 is an illustration of a step in a process for making a damascene structure in accordance with the teachings herein.
Figure 11:
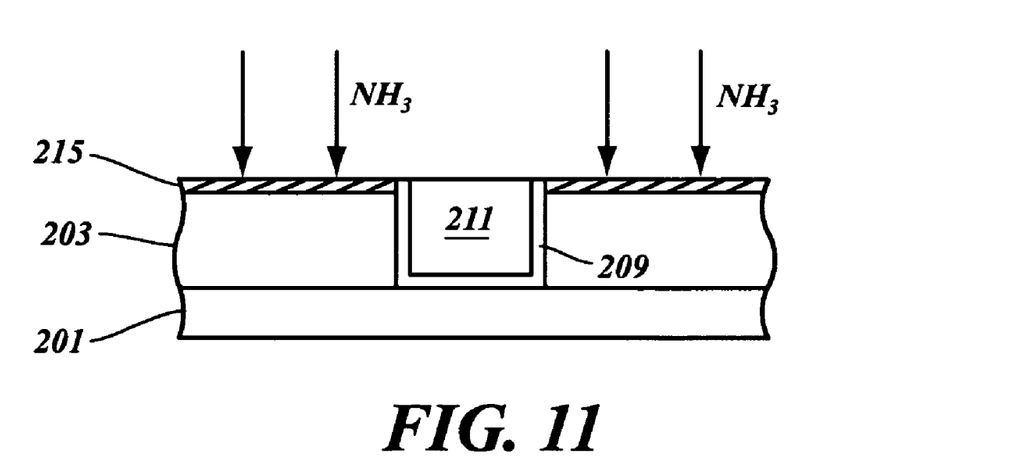
FIG. 11 is an illustration of a step in a process for making a damascene structure in accordance with the teachings herein.
Figure 12:
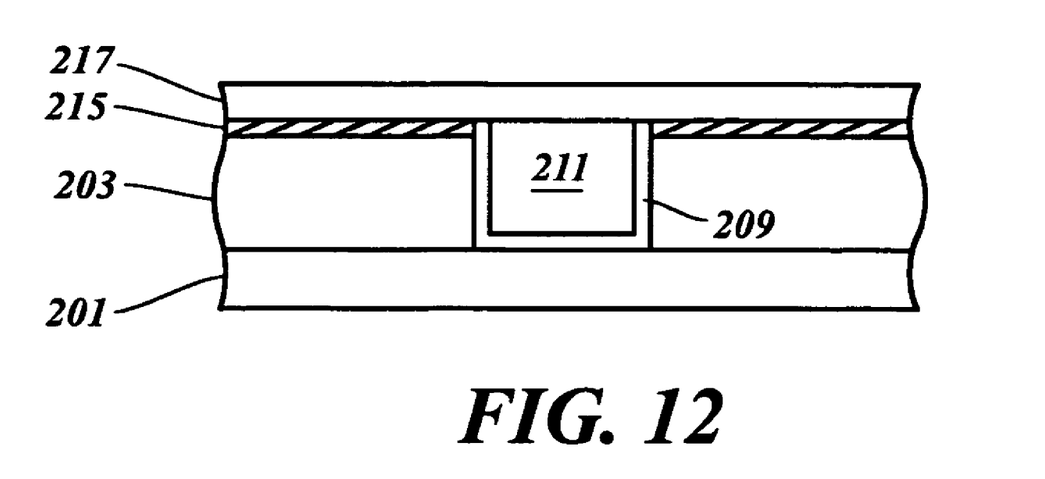
FIG. 12 is an illustration of a step in a process for making a damascene structure in accordance with the teachings herein.

As shown in FIG. 10, the surface of the ILD 203 which is exposed by the CMP process is then treated with a helium plasma. This results in the formation of a very thin passivation layer 213 on the surface of the ILD 203. The structure is subsequently treated with an $NH_3$ plasma as shown in FIG. 11. A barrier layer 217, which preferably comprises SiCN, is subsequently deposited over the structure as shown in FIG. 12. The treatment with the $NH_3$ plasma, as depicted in FIG. 11, serves to remove copper oxide from the surfaces of the copper interconnect and to improve adhesion between the copper interconnect 211 and the barrier layer 217 deposited on top of it. Here, it should be noted that a low oxide surface of the copper line is important for achieving good electromigration resistance.

Notably, the passivation layer 213 formed in the step depicted in FIG. 10 is essentially impervious to the reducing plasma that is employed in the subsequent step depicted in FIG. 11. Consequently, the presence of the passivation layer 213 protects the underlying ILD 203 from the $NH_3$ plasma, and prevents the k-value of the ILD from being adversely affected by the reducing plasma. As a result, semiconductor devices made in accordance with this process exhibit improved dielectric properties and performance characteristics.

Several variations are possible in the process depicted in FIGS. 6-11. For example, the process is depicted therein as utilizing a cap layer 205. The presence of a cap layer is advantageous in that it can be used as a polish hard mask during chemical mechanical polishing. However, the cap layer 205 typically has a higher dielectric constant than the underlying ILD 203, and thus the elimination of this layer would reduce the k-value of the overall dielectric stack. While it is possible, through polish optimization, to eliminate the cap layer 205, in practice, it is typically not advantageous to do so, because the cap layer 205 also serves to protect the bulk ILD from processing damage. Hence, in conventional damascene processes, any improvement in the k-value of the overall dielectric stack obtained by elimination of the cap layer would be negated by the increase in the k-value arising from the subsequent processing damage. The methodologies described herein overcome this problem, because the passivation surface obtained by treatment of the ILD with a helium plasma prevents damage to the bulk ILD. Hence, a cap layer is not necessary from a ILD film damage standpoint. The methodologies described herein are thus especially suitable for achieving a capless integration.

As a similar integration scheme, where a metallic barrier is selectively plated on the copper interconnect surface and a dielectric barrier is not used, then the dielectric stack for the next level of interconnect will be deposited after the metallic barrier plating. In this case, the ILD surface of the present level will be exposed to an oxidizing chemistry which may contain oxygen ($O_2$), tetraethylorthosilicate (TEOS, $Si(OC_2H_5)_4$), trimethylsilane ($SiH(CH_3)_3$), dimethylsilane ($SiH_2(CH_3)_2$), methylsilane ($SiH_3(CH_3)$), silane ($SiH_4$), octamethylcyclotetrasiloxane (OMCTS, $Si_4O_4(CH_3)_8$), diethoxymethylsilane (DEMS, $SiH(CH_3)(OC_2H_5)_2$), or combinations of the foregoing. Since oxidizing chemistries are also found to damage low-k films, the use of a helium plasma treatment prior to the deposition of the subsequent dielectric films can mitigate the increase in the dielectric constant that may result from exposure to plasma processing. As in the case of processes utilizing reducing plasmas or chemistries, the helium plasma treatment in processes utilizing oxidizing plasmas or chemistries preferably occurs just prior to the dielectric deposition step for the next level of interconnect, and will be accomplished in the same tool and, if possible, in the same chamber, without exposing the wafer to ambient air.

In the description above, reference has been made to the treatment of a substrate with a helium plasma (depicted in FIG. 10), and to the treatment of a substrate with an $NH_3$ plasma (depicted in FIG. 11). However, one skilled in the art will appreciate that, while helium and $NH_3$, respectively, will typically be the principle components of these plasmas, other ions and neutral species may also be present in these plasmas. For example, while the use of pure $NH_3$ as the reducing plasma in the step depicted in FIG. 11 has been described, the preferred method uses an $NH_3/N_2$ gas mixture, and other materials could also be used in the reducing plasma. These include, without limitation, $H_2$, $N_2$, noble gases such as He, Ar, and Ne, and various combinations and sub-combinations of the foregoing. Similarly, while He is preferably the principle component of the plasma utilized in the step depicted in FIG. 10, other ions and neutral species may also be present in these plasmas. Moreover, the chemistries of either plasma may be varied somewhat to achieve optimal results with a given substrate and under a given set of process parameters.

The reaction parameters used during the passivation process may also vary, and will typically depend, at least in part, on the gas or gases that are utilized in the plasma, and on the material of the dielectric layer. For example, when helium gas is used, the power level should be maintained within a range of from about 100 to about 1500 watts, preferably from about 100 to about 500 watts, and more preferably from about 100 to about 300 watts, with the typical power level being about 200 watts. The plasma power source may be a single frequency power source, such as, for example, a conventional 13.56 MHz source, or such a source may be used in conjunction with a low frequency power source, such as, for example, a 600-800 Hz power supply, with one or the other of the power supplies coupled to the substrate support on which the structure being treated is mounted.

The pressure in the reactor where the plasma passivation treatment is being carried out should range from about 1 Torr to about 10 Torr, preferably from about 5 to about 10 Torr, and most preferably from about 7 to about 9 Torr, with the typical pressure being maintained at 8.75 Torr. The temperature to which the exposed surface of the ILD is exposed to during the passivation treatment should be high enough to achieve efficient passivation of that surface, without exceeding a temperature at which the material of the ILD might be damaged or destroyed. Furthermore, when copper is present, the maximum temperature should be below that temperature at which the copper would be degraded or would diffuse into undesired regions of the structure. The temperature of the passivation treatment will typically range from about 200° C. to about 500° C., with a temperature range from about 300° C. to about 400° C. being preferred.

The duration of the passivation treatment will vary with the desired thickness of the layer of passivated dielectric material. Typically, the passivation treatment will be carried out from about 5 seconds to about 2 minutes, preferably from about 10 s to about 30 s, and typically about 20 s to form a passivation layer having a thickness ranging from about 50 Å to about 600 Å, and preferably from about 100 Å to about 400 Å, with a typical thickness being about 200 Å.

Various materials may be used in the dielectric layer in the devices and methodologies described herein. Preferably, the ILD material is a low-k or ultra low-k material such as carbon-doped silicon oxide.

The following examples illustrate the improvement in dielectric properties achievable with semiconductor devices made in accordance with the teachings herein.

Examples 1-2

Two blanket wafers were made with a standard dielectric stack that would be used in damascene processing as illustrated in FIGS. 1-5. SiCN was used as the barrier film, tetraethylorthosilicate (TEOS) was used as the cap layer material, and a carbon doped silicon oxide was used as the ILD. The dielectric constant of the ILD layer was determined for both wafers. The results are set forth in TABLE 1 as EXAMPLE 1 and 2.

Examples 3-4

The experiment of EXAMPLES 1-2 was repeated using the same blanket wafer type and the same materials for the wafer components. This time, however, the wafers were made in accordance with a damascene process of the type illustrated in FIGS. 6-12. The dielectric constant of the ILD layer was determined for both wafers after deposition of the Cu barrier (SiCN). The results are set forth in TABLE 1 as EXAMPLE 3 and 4.

TABLE 1

Measured Dielectric Constants for ILD

| EXAMPLE | Measured Dielectric Constant in ILD |
| --- | --- |
| 1 | 3.19 |
| 2 | 3.08 |
| 3 | 2.61 |
| 4 | 2.55 |

As seen from the results set forth in TABLE 1, the use of the methodology described herein resulted in significantly lower dielectric constants (a reduction in the dielectric constant of 0.47 to 0.64, or 15-21%) in the ILD as compared to the dielectric constants achieved in a similar device made by a conventional process.

The above description of the present invention is illustrative, and is not intended to be limiting. It will thus be appreciated that various additions, substitutions and modifications may be made to the above described embodiments without departing from the scope of the present invention. Accordingly, the scope of the present invention should be constructed in reference to the appended claims.

What is claimed is:

1. A method for creating a barrier layer on a substrate comprising a first dielectric layer and a metal interconnect, comprising:
   treating the substrate with a first plasma comprising helium, thereby forming a first treated substrate;
   exposing the first treated substrate to a second plasma comprising NH$_3$, thereby forming a second treated substrate;
   creating a barrier layer on the second treated substrate;
   depositing a second dielectric layer on the second treated substrate and barrier layer; and
   forming a level of interconnect over the second dielectric layer;
   wherein, prior to treatment of the substrate with the first plasma, the metal interconnect is formed by (a) creating a trench in the substrate, and (b) filling the trench with the metal.

2. Then method of claim 1, wherein treatment of the substrate with the first plasma treatment substantially reduces the permeability of the substrate to the second plasma.

3. The method of claim 1, wherein the dielectric layer is an inter-level dielectric (ILD) having a dielectric constant of less than 2.7.

4. The method of claim 1, wherein the first treated substrate is treated with the second plasma immediately following treatment of the substrate with the first plasma.

5. The method of claim 4, wherein the barrier layer is created in the same tool used to treat the substrate and the first treated substrate with the first and second plasmas, respectively, and wherein the substrate is maintained in a partial vacuum from the time when the substrate is treated with the first plasma to the time when the barrier layer is created.

6. The method of claim 1, wherein the barrier layer comprises a material selected from the group consisting of SiCN, SiC and SiN.

7. The method of claim 1, wherein the substrate is subjected to chemical mechanical polishing after the trench is filled with the metal, but before the substrate is treated with the first plasma, wherein a portion of the substrate adjacent to the trench has a cap layer disposed thereon, wherein the step of filling the trench with metal results in the formation of a layer of metal which extends over the cap layer, and wherein the layer of metal extending over the cap layer is removed through chemical mechanical polishing.

8. The method of claim 7, wherein the cap layer is used as a polish hard mask during the chemical mechanical polishing.

9. The method of claim 7, wherein the cap layer is removed by CMP or etching prior to treatment of the substrate with the first plasma.

10. The method of claim 1, wherein the metal comprises copper, and wherein the barrier layer prevents copper diffusion in to the dielectric substrate.

11. The method of claim 1, wherein the barrier layer comprises a material selected from the group consisting of TiW, Ti, TiN, Ta, and TaN.

12. The method of claim 1, wherein the second plasma is a reducing plasma that reduces the metal interconnect.

13. The method of claim 1, wherein the barrier layer extends over the dielectric layer.

14. A method for preparing a substrate comprising a dielectric layer and a cap layer for the application of a barrier layer thereto, comprising:
   creating a trench which extends through the cap layer and into the dielectric layer;
   depositing a layer of metal over the substrate such that the metal fills the trench and a portion of the metal extends over the cap layer;
   subjecting the substrate to chemical mechanical polishing so that the portion of the layer of metal which extends over the cap layer is removed, thereby exposing a portion of the dielectric layer;
   treating the exposed portion of the dielectric layer with a first plasma comprising helium, thereby forming a treated surface;

treating the metal with a second plasma comprising NH$_3$, thereby forming a second treated surface creating a barrier layer on the second treated surface and on the metal;

depositing a second dielectric layer on the second treated substrate and barrier layer; and forming a level of interconnect over the second dielectric layer.

15. The method of claim 14, wherein the metal comprises copper.

16. The method of claim 14 wherein, prior to depositing the layer of metal, a layer of a barrier metal is deposited over the surfaces of the trench.

17. A method for preparing a substrate comprising a first dielectric layer and a cap layer for the application of subsequent metal level dielectric layer thereto, comprising:

creating a trench which extends through the cap layer and into the dielectric layer;

depositing a layer of metal over the substrate such that the metal fills the trench and a portion of the metal extends over the cap layer;

subjecting the substrate to chemical mechanical polishing so that the portion of the layer of metal which extends over the cap layer is removed, thereby exposing a portion of the dielectric layer;

plating a selective metal barrier on top of the metal in the trench;

treating the exposed portion of the dielectric layer with a first plasma treatment comprising helium, thereby forming a first treated surface;

treating the first treated surface with a second plasma treatment comprising NH$_3$, thereby forming a second treated surface;

depositing a second dielectric layer on the second treated surface and metal barrier; and forming a level of interconnect over the second dielectric layer.

18. The method of claim 17, wherein the metal barrier is deposited by electroless process.

19. The method of claim 17, wherein the metal barrier comprises a material selected from the group consisting of Co, W, B, P, Ni, and Ru.

* * * * *